United States Patent
Morand

(10) Patent No.: US 8,166,769 B2
(45) Date of Patent: May 1, 2012

(54) SELF-COOLED VERTICAL ELECTRONIC COMPONENT

(75) Inventor: Jean-Luc Morand, Tours (FR)

(73) Assignee: STMicroelectronics S.A., Montrouge (FR)

( * ) Notice: Subject to any disclaimer, the term of this patent is extended or adjusted under 35 U.S.C. 154(b) by 330 days.

(21) Appl. No.: 12/550,578

(22) Filed: Aug. 31, 2009

(65) Prior Publication Data

US 2009/0314008 A1   Dec. 24, 2009

Related U.S. Application Data

(62) Division of application No. 11/282,830, filed on Nov. 18, 2005, now abandoned.

(30) Foreign Application Priority Data

Nov. 18, 2004 (FR) .................................. 04 52671

(51) Int. Cl.
   *F25B 21/02* (2006.01)
(52) U.S. Cl. ................................ 62/3.2; 62/3.7; 62/338

(58) Field of Classification Search ............... 62/389, 62/338, 390, 3.2, 3.7; 220/565, 371, 370; 210/240, 282, 295, 304; 222/189.06
See application file for complete search history.

(56) References Cited

U.S. PATENT DOCUMENTS

| | | | |
|---|---|---|---|
| 5,475,340 A * | 12/1995 | Gose | 327/565 |
| 6,380,565 B1 * | 4/2002 | Duclos et al. | 257/107 |
| 6,921,930 B2 * | 7/2005 | Simonnet | 257/119 |
| 6,948,321 B2 * | 9/2005 | Bell | 62/3.2 |
| 6,963,087 B2 * | 11/2005 | Gimonet et al. | 257/119 |
| 6,987,983 B2 * | 1/2006 | Kondo et al. | 455/550.1 |
| 2001/0050099 A1 * | 12/2001 | Shakouri et al. | 136/201 |
| 2004/0210289 A1 * | 10/2004 | Wang et al. | 607/116 |

* cited by examiner

*Primary Examiner* — Mohammad Ali
(74) *Attorney, Agent, or Firm* — Wolf, Greenfield & Sacks, P.C.

(57) ABSTRACT

A self-cooled electronic component comprising a vertical monolithic circuit, in which the vertical monolithic circuit is electrically connected in series with a Peltier cooler so that the D.C. current flowing through the circuit supplies the cooler and in which the circuit and the cooler are placed against each other so that the cold surface of the cooler is in thermal contact with the circuit.

18 Claims, 2 Drawing Sheets

SELF-COOLED VERTICAL ELECTRONIC COMPONENT

CROSS REFERENCE TO RELATED APPLICATIONS

This application is a division of U.S. application Ser. No. 11/282,830, filed Nov. 18, 2005, entitled Self-Cooled Vertical Electronic Component, which application is hereby incorporated by reference herein in its entirety.

BACKGROUND OF THE INVENTION

1. Field of the Invention

The present invention relates to the cooling of electronic components. More specifically, the present invention relates to the cooling of a vertical monolithic circuit capable of conducting a one-way current entering or coming out through its rear surface.

2. Discussion of the Related Art

In monolithic electronic components or circuits, it is necessary to carry off the heat generated during operation. In particular, for semiconductor components with a junction, it is necessary to avoid changes in the temperature of the active junctions to guarantee stable operation characteristics.

FIG. 1 is a simplified cross-section view of a vertical electronic component 1 made in monolithic form in a semiconductor substrate, or vertical monolithic circuit. Component 1 comprises a metallization 5 on a rear surface. A current flows through the component from one or several metallizations (not shown) formed on the front surface towards rear surface metallization 5. To cool down the component, metallization 5 is thermally connected to an element for carrying off the heat or heat sink 7. Metallization 5 is generally electrically isolated from heat sink 7 by a thermally conductive element, generally a ceramic plate, a resin layer, or an isolating film 9.

The carrying off of the heat of heat sink 7 is performed by natural heat convection or by an airflow generated by a ventilator (not shown).

To improve the heat carrying-off, a heat pipe area of small dimensions, formed of an area comprising cavities in which a cooling fluid can flow, is sometimes formed in component 1.

In spite of this, for high-voltage one-way components such as diodes, transistors, or thyristors intended to operate at high powers on the order of several tens of watts or more, malfunctions can be observed. Such malfunctions are imputed to a drift in the characteristics (switching thresholds) as a result of a repeated heating of a component junction or area.

Further, Peltier coolers, which enable cooling heat sources, are known. Such coolers are, for example, formed of elementary cells comprising thermoelectric elements of two opposite conductivity types N and P.

FIG. 2 is a partial simplified cross-section view of the structure of a Peltier effect cell 10 on which is arranged a load to be cooled down.

Cell 10 comprises a first N-type doped thermoelectric element 11 and a second P-type doped thermoelectric element 12. First and second thermoelectric elements 11 and 12 are, for example, made of bismuth telluride ($Bi_2Te_3$). Element 11 is selenium-doped (type N) while element 12 is doped with antimony (type P). Elements 11 and 12 are electrically connected in series and thermally connected in parallel. For this purpose, elements 11 and 12 are laterally isolated, electrically and thermally. Their front surfaces are connected to a same conductive wafer 14. The rear surface of element 11 is integral with a metal plate 17 and the rear surface of element 12 is integral with a metal plate 18. Plate 17 is connected to a current input terminal A. Wafer 18 is connected to a current output terminal B. At its front surface, a thermally conductive and electrically isolating plate 20 forms a tray on which a load to be cooled down can be laid. At its rear surface, a thermally conductive and electrically isolating plate 22 thermally connects metallizations 17 and 18 to a heat sink 23.

In operation, a voltage such that cell 10 conducts a current entering through terminal A and coming out through terminal B, that is, running from N-type element 11 to P-type element 12, is applied between terminals A and B of cell 10. The current flow direction is indicated by arrows in FIG. 2. Then, plate 14 becomes a cold source at a temperature on the order of −10° C. for a current on the order of one ampere, while heat sink 23 becomes a hot source at a temperature from 30 to 50° C.

Peltier coolers seem extremely attractive and exhibit at first sight many advantages with respect to conventional heat dissipation systems but have not found many practical applications except, possibly, to cool down devices under confined or dangerous atmosphere. One of their disadvantages is that they require an autonomous current source capable of providing a high current.

SUMMARY OF THE INVENTION

The present invention aims at using such coolers in a manner adapted to the cooling of a vertical monolithic circuit.

The present invention also aims at providing a system capable of self-adapting to the thermal power to be dissipated.

Generally, the present invention provides placing against a vertical monolithic circuit a Peltier cooler so that the cold surface of the cooler is in thermal contact with the circuit and that the D.C. current flowing through the circuit also forms the current generating the Peltier effect. The assembly thus formed is a self-cooled electronic component.

According to an embodiment of the present invention, the cooler comprises an odd number of concentric regions of a thermoelectric semiconductor material, of alternate conductivity types laterally isolated, and electrically connected in series, a surface of the central region corresponding to a first terminal, and an opposite surface of the external region corresponding to a second terminal.

According to an embodiment of the present invention, the cooler comprises three concentric regions: a central region of a first conductivity type; a ring-shaped region of a second conductivity type extending around the central region and being laterally electrically and thermally isolated from the central region; and a peripheral region of the first conductivity type extending around the ring-shaped region and being electrically and thermally laterally isolated from the ring-shaped region; the central, ring-shaped, and peripheral regions being of the same depth; the central and ring-shaped regions being thermally and electrically interconnected by a central metal plate on a first hot or cold surface of the cooler; and the ring-shaped and peripheral regions being thermally and electrically interconnected by a ring-shaped metal plate on a second cold or hot surface of the cooler.

According to an embodiment of the present invention, the central region is integral with a first current input/output metallization; and the peripheral region is integral with a second current input/output metallization, the first and second current input/output metallizations being formed on opposite surfaces of the cooler and being thermally and electrically isolated from the neighboring metal plate of interconnection of the central region to the ring-shaped region or of the ring-shaped region to the peripheral region.

According to an embodiment of the present invention, the surface areas of the central, ring-shaped, and peripheral regions are equal.

According to an embodiment of the present invention, the current coming from the circuit enters the cooler through the first metallization and comes out through the second metallization, the first conductivity type being type P and the second conductivity type being type N.

According to an embodiment of the present invention, a full-plate metallization extends over the entire surface of the system comprising the metal plate of interconnection of the central region to the ring-shaped region, and is electrically isolated form said interconnection metal plate.

The foregoing and other objects, features, and advantages of the present invention will be discussed in detail in the following non-limiting description of specific embodiments in connection with the accompanying drawings.

DETAILED DESCRIPTION

Figure 1:
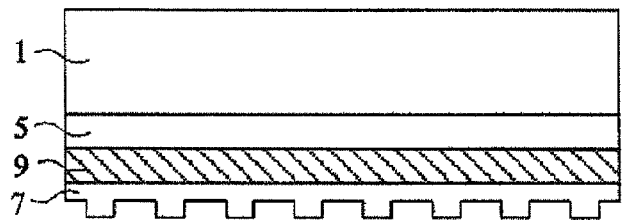
FIG. 1 illustrates, in a partial simplified cross-section view, a vertical monolithic component associated with a heat carry-off heat sink.
Figure 2:
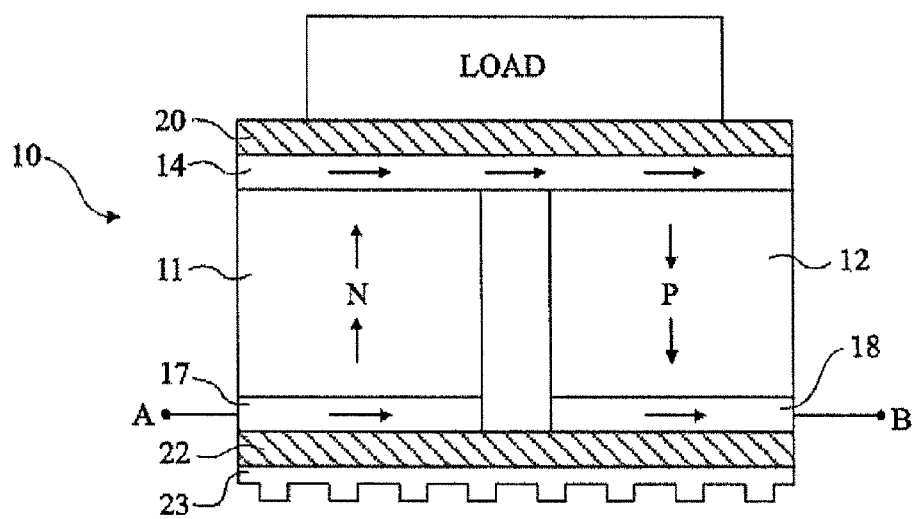
FIG. 2 illustrates, in a partial simplified cross-section view, a conventional Peltier cooler.

For clarity, the same elements have been designated with the same reference numerals in the different drawings and, further, as usual in the representation of integrated circuits, the various drawings are not drawn to scale.

Figure 3:
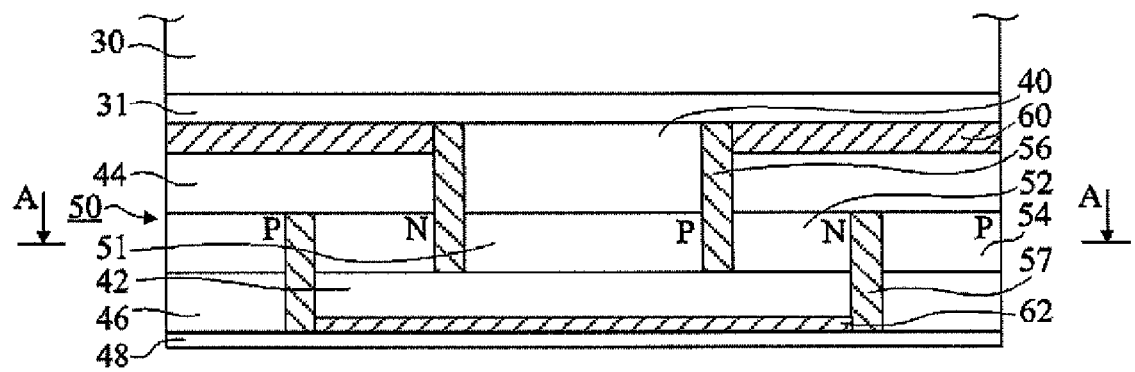
FIG. 3 illustrates, in partial simplified cross-section view, a system for cooling a vertical monolithic circuit according to an embodiment of the present invention.

FIG. 3 is a partial simplified cross-section view of a cooling system according to an embodiment of the present invention.

The rear surface of a monolithic, vertical, one-way electronic component 30 comprises a current output metallization 31.

Metallization 31 rests on a planar surface having a central conductive portion 40 in electric and thermal contact with a region 51 of a cell of a Peltier cooler 50. According to an aspect of the present invention, central portion 40 is a metal plate.

Figure 4:
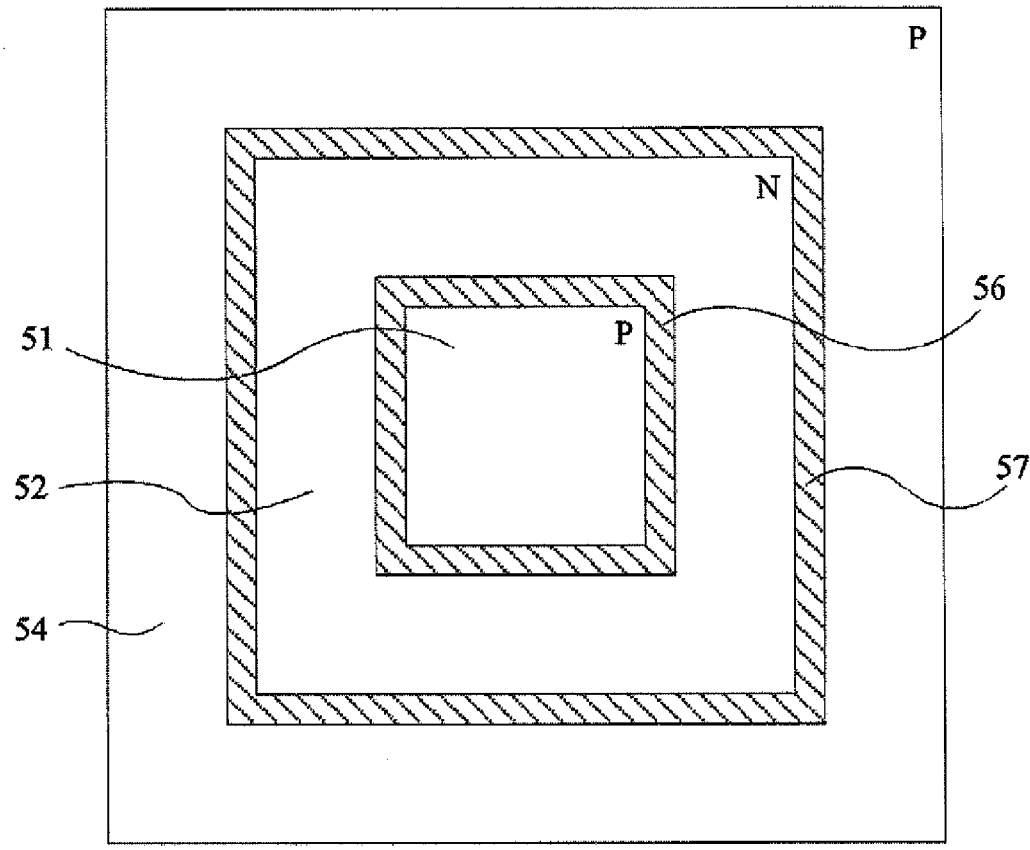
FIG. 4 is a partial simplified top view of an internal portion of the structure of FIG. 3 observed in plane A-A.

As also illustrated by the top view of FIG. 4, seen in plane A-A of FIG. 3, the Peltier cooler comprises a central P-type region 51, a ring-shaped N-type region 52 extending around central region 51, and a peripheral P-type region 54 extending around ring-shaped region 52. Central region 51, ring-shaped region 52, and peripheral region 54 are semiconductor regions of a thermoelectric semiconductor substrate. The upper and lower surfaces of central region 51, ring-shaped region 52, and peripheral region 54 are coplanar. Central region 51 is laterally thermally and electrically isolated from ring-shaped region 52 by an isolation wall 56. Ring-shaped region 52 is laterally thermally and electrically isolated from peripheral region 54 by an isolation wall 57.

Central region 51, ring-shaped region 52, and peripheral region 54 are electrically connected in series and thermally connected in parallel two-by-two, as described hereafter in relation with FIG. 3.

Central region 51 is electrically and thermally connected to ring-shaped region 52 by a conductive plate 42. Plate 42 is opposite to plate 40 of connection to metallization 31 of component 30, for example, at the rear surface.

At the front surface, a ring-shaped plate 44 electrically and thermally connects ring-shaped region 52 and peripheral region 54. Ring-shaped plate 44 extends around central plate 40 and is electrically and thermally isolated therefrom by isolation wall 56. Ring-shaped plate 44 is electrically isolated but thermally coupled to metallization 31 of component 30 by an isolation element 60, for example, made of ceramics. The upper surface of isolating element 60 is coplanar with the upper surface of central plate 40.

At the rear surface, peripheral region 54 is connected via an electrically and thermally conductive ring-shaped plate 46 to a rear surface metallization 48 of the cooling system. Plate 46 extends around plate 42. Isolation wall 57 laterally isolates plate 42 from ring-shaped plate 46 thermally and electrically. An element 62 electrically isolates plate 42 from metallization 48. Element 62, however, enables a thermal conduction between rear central portion 42 and metallization 48. The dimensions of plates 42 and 46 and of element 62 are selected so that the front surface of metallization 48 in contact with plate 46 and element 62 is planar. The rear surface of metallization 48 may be connected to a heat sink.

According to an embodiment of the present invention, rear metallization 31 of component 30, front metal plate 40, rear plate 42, front ring-shaped plate 44, and rear ring-shaped 46 are made of copper or of a copper-based alloy.

According to an embodiment of the present invention, the individual surfaces of each of central region 51, ring-shaped region 52, and peripheral region 54 of the Peltier cooler are substantially equal. The values of these individual surfaces as well as the thickness of the above-mentioned regions will be selected, as will appear from what follows, according to the D.C. current that flows through component 30.

According to an embodiment to the present invention, thermal and electric isolation walls 56 and 57 are thick isolators, for example, on the order of a few tens of µm. Thermally conductive electric isolators 60, 62, and 64 are thin isolators, for example, on the order of a few hundreds of µm.

According to an embodiment of the present invention, central region 51, ring-shaped region 52, and peripheral region 54 are formed in a bismuth telluride substrate, ring-shaped region 52 being a region doped with selenium and central region 52 and peripheral region 54 being doped with antimony.

When vertical monolithic circuit 30 operates, a current comes out of its rear surface metallization 31. The current penetrates into the Peltier effect cell through central P-type region 51 from front central plate 40 to rear plate 42. It then passes from rear plate 42 into ring-shaped region 52 towards front ring-shaped plate 44. Finally, the current flows through peripheral region 54 and comes out through rear ring-shaped plate 46 and metallization 48. Under such conditions, the front surface of the system, that is, plates 40 and 44, becomes a cold source. This cold source cools down rear metallization 31 of component 30, and thus the junction or area thereof under heating.

The operating temperature of vertical monolithic circuit 30 is then advantageously lowered and stabilized. This enables improving the circuit operation and increasing its lifetime.

An advantage of the present invention is that the cooling system according to the present invention does not use a separate power supply.

According to an embodiment of the present invention, in the case of average powers to be dissipated, that is, when the current is on the order of from a few amperes to a few tens of amperes, the different thicknesses of the elements forming the cooler are low and said cooler may advantageously be formed directly on the rear surface of the vertical monolithic one-way component with which it is associated.

According to an embodiment of the present invention, the cooler is formed separately from the vertical monolithic one-way component with which it is associated, after which they are joined by an appropriate technique, for example, by gluing or soldering.

Of course, the present invention is likely to have various alterations, improvements, and modifications which will readily occur to those skilled in the art. In particular, it will be within the abilities of those skilled in the art to make any material and thickness modification necessary in a given technological process. Thus, it will be within the abilities of those skilled in the art to adapt the isolating materials to the desired electric or electric and thermal isolation function.

Similarly, it will be within the abilities of those skilled in the art to adapt the used conductive materials to the used technological process. In particular, those skilled in the art will adapt the conductive material forming the different metallizations 31 and 48 and conductive plates 40, 42, 44, and 46 to the thermal and electric conduction constraints of the component.

It will also be within the abilities of those skilled in the art to adapt the dimensions, especially the surface area, and the doping levels of central region 51, ring-shaped region 52, and peripheral region 54, in particular according to the current constraints. It should be noted that the thickness of the thermoelectric substrate in which are formed central region 51, ring-shaped region 52, and peripheral region 54, depends on the desired temperature decrease. In the considered example of a bismuth telluride substrate, a thickness on the order of from 5 to 20 micrometers would be enough. Substrates of such a thickness may be directly deposited on the rear surface of a vertical monolithic one-way component, for example, by a pulsed laser deposition. It should further be understood by those skilled in the art that bismuth telluride has been described as a thermoelectric semiconductor element as a non-limiting example only.

It should also be noted that the cooler according to the present invention could be turned over, its lower surface in the drawings being in electric contact by its periphery with the rear surface metallization of the vertical electronic circuit and the central portion of its upper surface in the drawings forming the second terminal of the self-cooled component. Further, although it is currently preferred to use a cooler with three concentric regions of alternate conductivity types of a thermoelectric semiconductor material, other numbers of regions and other arrangements may be selected by those skilled in the art to adapt to specific practical conditions.

Further, only those elements necessary to the understanding of the present invention have been described. In particular, it will be within the abilities of those skilled in the art to complete the structure of FIGS. 3 and 4 with any necessary element such as, for example, an airflow forced by a ventilation system.

Figure 5:
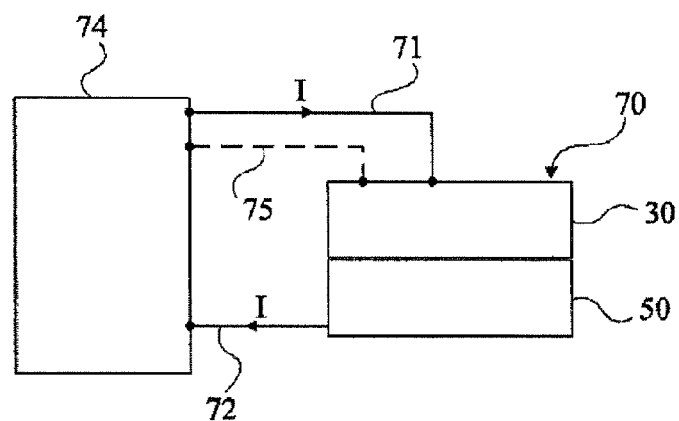
FIG. 5 is a simplified view of a self-cooled electronic component according to the present invention.

Thus, the present invention, as illustrated in FIG. 5, provides the forming of a self-cooled electronic component 70, formed of a vertical monolithic circuit 30 and of a Peltier cooler 50 conducting a same current I, capable of being connected by conductors 71 and 72 to a circuit 74.

The one-way electronic component may be a one-way component by nature, for example, a diode or a thyristor. This may also be a bi-directional conduction element inserted in a circuit such that it can only conduct a current of a determined direction, for example, a resistor or another passive component connected to a circuit comprising a series diode. A possible connection between circuit 74 and a control terminal of component 30 has also been shown in FIG. 5 by a dotted line 75. The present invention may also apply to the field of integrated circuits, for example, by providing for the rear surface to be metallized and to correspond to a terminal of the integrated circuit intended to be connected to an external supply or supply reference terminal. A current substantially corresponding to the total current consumed by the integrated circuit when it is operating then enters or comes out through this rear surface metallization. Thus, in the following claims, term "vertical monolithic circuit" should be interpreted as covering any type of discrete or integrated component, active or passive, in which a current is extracted or introduced through the rear surface.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A self-cooled electronic component comprising:
   a Peltier cooler; and
   a vertical monolithic circuit formed in a first semiconductor substrate and formed separately from the Peltier cooler, the circuit comprising a one-way component and being a load to be cooled, and the vertical monolithic circuit being electrically connected in series with the Peltier cooler such that when a D.C. current flows through the vertical monolithic circuit, the same D.C. current flows from the vertical monolithic circuit to the cooler to supply the D.C. current to the cooler, wherein the circuit and the cooler are placed against each other so that a cold surface of the cooler is in thermal contact with the vertical monolithic circuit;
   wherein the Peltier cooler comprises an odd number of concentric regions of a second thermoelectric semiconductor material, of alternating conductivity types, laterally isolated, and electrically connected in series, a surface of a central region corresponding to a first terminal, and an opposite surface of an external region corresponding to a second terminal.

2. The self-cooled electronic component of claim 1, wherein the one-way component comprises a high-voltage one-way component.

3. The self-cooled electronic component of claim 1, wherein the central, ring-shaped, and peripheral regions are the same depth.

4. The self-cooled electronic component of claim 1, wherein the cooler comprises three concentric regions:
   (1) the central region being of a first conductivity type;
   (2) a ring-shaped region of a second conductivity type extending around the central region and electrically and thermally laterally isolated from the central region; and
   (3) the external region, the external region comprising a peripheral region of the first conductivity type extending around the ring-shaped region and electrically and thermally laterally isolated from the ring-shaped region;
   the central, ring-shaped, and peripheral regions being of substantially the same depth;
   the central and ring-shaped regions being thermally and electrically interconnected by a metal plate on a first hot or cold surface of the cooler; and the ring-shaped and peripheral regions being thermally and electrically interconnected by a ring-shaped metal plate on a second cold or hot side of the cooler.

5. The self-cooled electronic component of claim 4, wherein the central region is integral with a first current input/output metallization; and wherein the peripheral region is integral with a second current input/output metallization, the first and second current input/output metallizations being formed on opposite surfaces of the cooler, and being electrically isolated from the nearest of the metal plate that interconnects the central region to the ring-shaped region and the metal plate that interconnects the ring-shaped region to the peripheral region.

6. The self-cooled electronic component of claim 5, wherein current coming from the circuit enters the cooler through the first metallization and comes out through the second metallization, the first conductivity type being type P and the second conductivity type being type N.

7. The self-cooled electronic component of claim 5, wherein the second current input/output metallization comprises a full-plate metallization extending over the entire surface of the metal plate that interconnects the central region to the ring-shaped region, and wherein the full-plate metallization is electrically isolated form said metal interconnection plate.

8. The self-cooled electronic component of claim 4, wherein the metal plate is a central metal plate.

9. A Peltier cooler in combination with a vertical monolithic circuit, the combination comprising:
  a vertical monolithic circuit formed in first semiconductor substrate material, the vertical monolithic circuit comprising a one-way component and being a load to be cooled; and
  a Peltier cooler comprising an odd number of concentric regions of alternating conductive types of a second thermoelectric semiconductor material, the regions being laterally isolated and electrically connected in series, a surface of a central region corresponding to a first terminal, the first terminal being in direct contact with a portion of the vertical monolithic circuit, and an opposite surface of an external region corresponding to a second terminal;
  wherein the vertical monolithic circuit is formed separately from the Peltier cooler, and the vertical monolithic circuit is configured to supply an electrical current to the Peltier cooler.

10. The combination of claim 9, wherein the one-way component comprises a high-voltage one-way component.

11. A Peltier cooler in combination with a vertical monolithic circuit, the combination comprising:
  a vertical monolithic circuit formed in a first semiconductor substrate material and being a load to be cooled, the vertical monolithic circuit comprising a one-way component; and
  a Peltier cooler comprising:
    a central region of a first conductivity type of a thermoelectric semiconductor material which is separate from the first semiconductor material, the central region being adapted to being placed against at least a portion of a main surface of a vertical monolithic circuit;
    a ring-shaped region of a second conductivity type of a thermoelectric semiconductor material which is separate from the first semiconductor material, the ring-shaped region extending around the central region and being laterally electrically and thermally isolated from the central region; and
    a peripheral region of the first conductivity type of a thermoelectric semiconductor material which is separate from the first semiconductor material, the peripheral region extending around the ring-shaped region and being electrically and thermally laterally isolated from the ring-shaped region;
    the central, ring-shaped, and peripheral regions being of substantially the same depth;
    the central and ring-shaped regions being thermally and electrically interconnected by a central metal plate on a first hot or cold side of the cooler; and
    the ring-shaped and peripheral regions being thermally and electrically interconnected by a ring-shaped metal plate on a second cold or hot side of the cooler;
  wherein the vertical monolithic circuit is formed separately from the Peltier cooler, and the vertical monolithic circuit and the Peltier cooler are configured such that an electrical current can pass between the vertical monolithic circuit and the Peltier cooler.

12. The combination of claim 11, wherein the one-way component comprises a high-voltage one-way component.

13. The Peltier cooler of claim 11, wherein a surface of the central region corresponds to a first terminal, and a surface of the peripheral region corresponds to a second terminal.

14. The Peltier cooler of claim 11, wherein the central region, the ring-shaped region and the peripheral region comprise concentric regions.

15. A method of cooling a vertical monolithic circuit comprising:
  placing a cooling surface of a Peltier cooler into thermal contact with a vertical monolithic circuit which has been formed separately from the Peltier cooler, the vertical monolithic circuit comprising a one-way component and being a load to be cooled;
  supplying an electrical current from the circuit to the cooler by:
    running the electrical current from a first surface metallization of the circuit, through a front central electrically and thermally conductive plate of the cooler, through a central region having a first conductivity type, and to a rear electrically and thermally conductive plate;
    further running the electrical current from the rear plate, through a ring-shaped region having a second conductivity type, the ring-shaped region being laterally isolated, both thermally and electrically, from the central region, and into a ring-shaped electrically and thermally conductive plate;
    further running the electrical current from the ring-shaped plate, through a second ring-shaped region having the first conductivity type, the ring-shaped region being peripheral to the ring-shaped plate, and into a second surface metallization;
  wherein the electrical current path results in a removal of heat energy from the front central plate.

16. The method of claim 15, wherein the first conductivity type is P-type and the second conductivity type is N-type.

17. The method of claim 16, wherein the current is run through a central p-type region, a ring-shaped n-type region, and a ring-shaped p-type region having substantially the same depth.

18. The method of claim 15, wherein the one-way component comprises a high-voltage one-way component.

* * * * *